(12) United States Patent
Kou

(10) Patent No.: US 8,161,347 B1
(45) Date of Patent: Apr. 17, 2012

(54) INTERLEAVING PARITY BITS INTO USER BITS TO GUARANTEE RUN-LENGTH CONSTRAINT

(75) Inventor: Yu Kou, San Jose, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1348 days.

(21) Appl. No.: 11/787,111

(22) Filed: Apr. 12, 2007

(51) Int. Cl.
*G11B 20/14* (2006.01)
*G11B 20/18* (2006.01)
*H03M 7/46* (2006.01)
*H03M 13/29* (2006.01)

(52) U.S. Cl. .......................................... 714/755; 341/59
(58) Field of Classification Search .................. 714/755; 341/59
See application file for complete search history.

(56) References Cited

U.S. PATENT DOCUMENTS

| | | | |
|---|---|---|---|
| 6,795,947 B1 * | 9/2004 | Siegel et al. | 714/802 |
| 6,963,296 B2 * | 11/2005 | Oki et al. | 341/106 |
| 7,409,622 B1 * | 8/2008 | Lu et al. | 714/755 |
| 7,719,444 B2 * | 5/2010 | Cideciyan | 341/59 |
| 2008/0276156 A1 | 11/2008 | Gunnam et al. | |
| 2008/0301521 A1 | 12/2008 | Gunnam et al. | |

* cited by examiner

*Primary Examiner* — Stephen Baker
(74) *Attorney, Agent, or Firm* — Van Pelt, Yi & James LLP

(57) ABSTRACT

A method of satisfying a specified run length constraint is disclosed. A systematically error correction encoded sequence of received symbols is received, wherein the received symbols include data symbols and parity symbols. The parity symbols are interleaved with the data symbols to produce interleaved symbols that satisfy the specified run length constraint.

20 Claims, 5 Drawing Sheets

INTERLEAVING PARITY BITS INTO USER BITS TO GUARANTEE RUN-LENGTH CONSTRAINT

BACKGROUND OF THE INVENTION

Forward error correction and line coding are used together in digital communications and storage technologies. These technologies find wide application, including disc drives, where high rate line codes are used. When high rate line codes are used, there is a risk of forward error correction failure from line coding error propagation. Therefore, there exists a need for a system to reduce or eliminate the risk of forward error correction failure from line coding error propagation.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
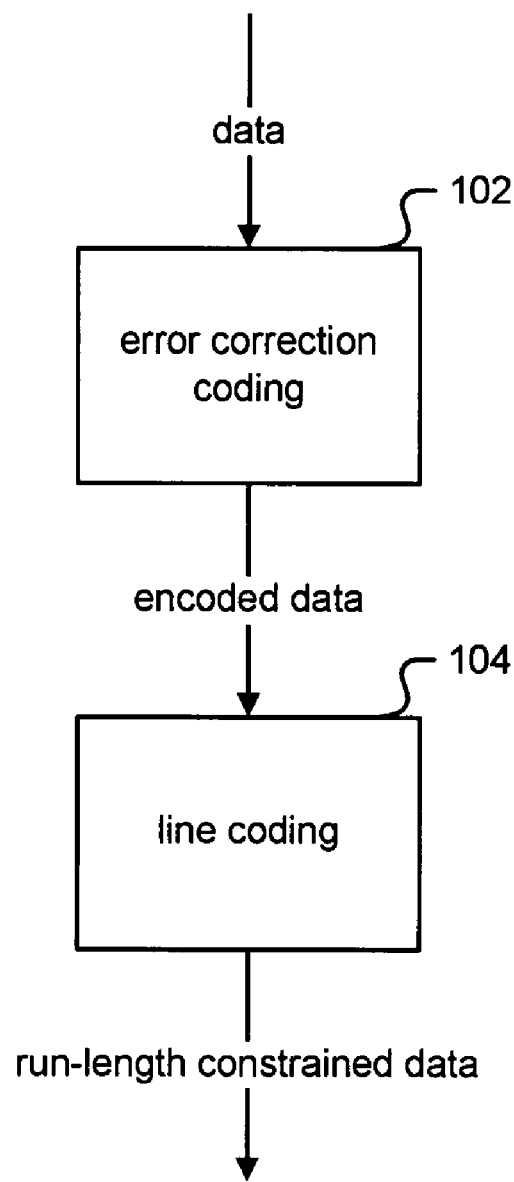
FIG. 1 is a block diagram illustrating an embodiment of an encoding process.

FIG. 1 is a block diagram illustrating an embodiment of an encoding process. The encoding process may be used in a digital communications device or a digital storage device, including a disc drive system.

In the example shown, data to be encoded is first processed using forward error correction with an error correction coding ("ECC") 102 method. Forward error correction allows the reader of encoded data to detect data errors, correct data errors, or both detect and correct data errors, based on redundant data inserted in ECC 102 called parity.

The encoded data is then processed using a line coding 104 method. Line coding modulates data for a specific digital communications channel or digital storage medium. For a disc drive system, the magnetic fields or optical media must contain frequent transitions to provide sufficient information for timing control.

Figure 2A:
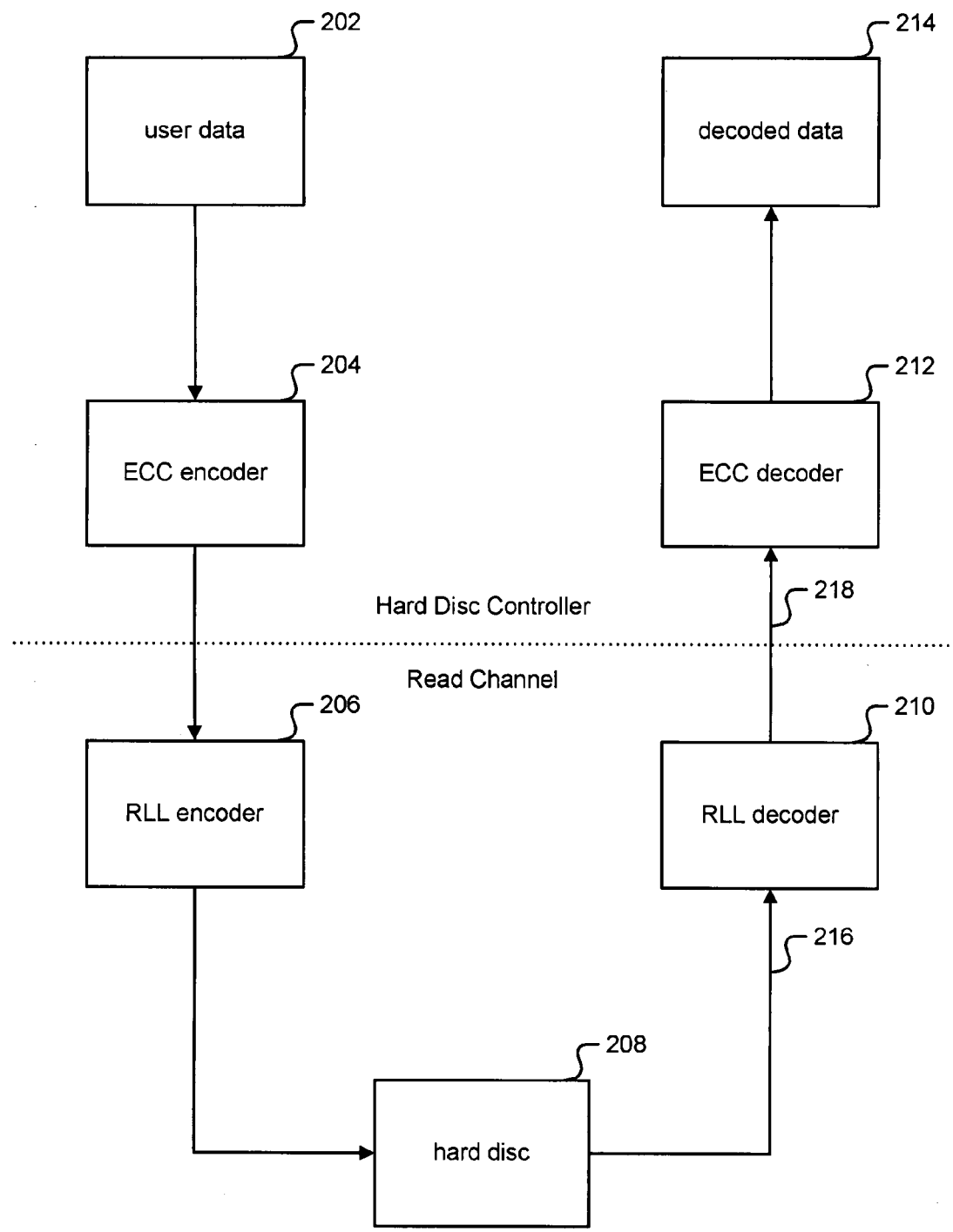
FIG. 2A is a block diagram illustrating an example of a technique for error correction coding coupled with line coding in a hard disc drive system.

FIG. 2A is a block diagram illustrating an example of a technique for error correction coding coupled with line coding in a hard disc drive system. In the example shown, user data 202, ECC encoder 204, ECC decoder 212, and decoded data 214 are part of the hard disc controller. In the example shown, run-length limited ("RLL") encoder 206, RLL decoder 210 and the hard disc 208 are part of the read channel.

In the example shown, user data 202 is first encoded using ECC encoder 204. The ECC code may be, for example, a Reed-Solomon code or a low density parity check ("LDPC") code. The encoded data is then passed to the RLL encoder 206. RLL encoders are specified both by their rate and their run-length constraints to satisfy an intended line coding modulation shaping. Throughout this specification, an RLL encoder is expressed as a "rate-m/n (d, G/I)" RLL code, where:

m/n is the rate of the code, the fraction of input bits m to the RLL encoder over the output bits n.

d is the minimum number of zeroes between two ones in the encoded run length constrained sequence;

G is the maximum number of zeroes between two ones in the encoded run length constrained sequence; and when looking at two different subsequences, one composed of each odd bit in the encoded DC-balanced sequence, and the other composed of each even bit in the encoded DC-balanced sequence, I is the maximum number of zeroes between two ones in either subsequence.

An example of an RLL code used in for modern hard disc systems is a rate-200/201 (0, 20/20) RLL code. This code maps a 201 bit DC balanced sequence codeword that satisfies the (0, 20/20) run-length constraints, for every 200 bit input sequence.

The main vulnerability of this technique is a problem referred to as "error propagation"; a single error within the RLL code is propagated throughout the entire RLL codeword in RLL decoder 210. For example, for a rate-200/201 (0, 20/20) RLL code in the hard disc system shown in FIG. 2A, a single bit error at point 216 going to the input of the RLL decoder 210 results in up to 200 bits in error at point 218 at the input to the ECC decoder 212. For a hard disc system with 10 bits per symbol in the ECC code, this may results in up to 20 symbol errors at ECC decoder 212. One approach to cope with this large error propagation has been using a reverse coding technique.

Figure 2B:
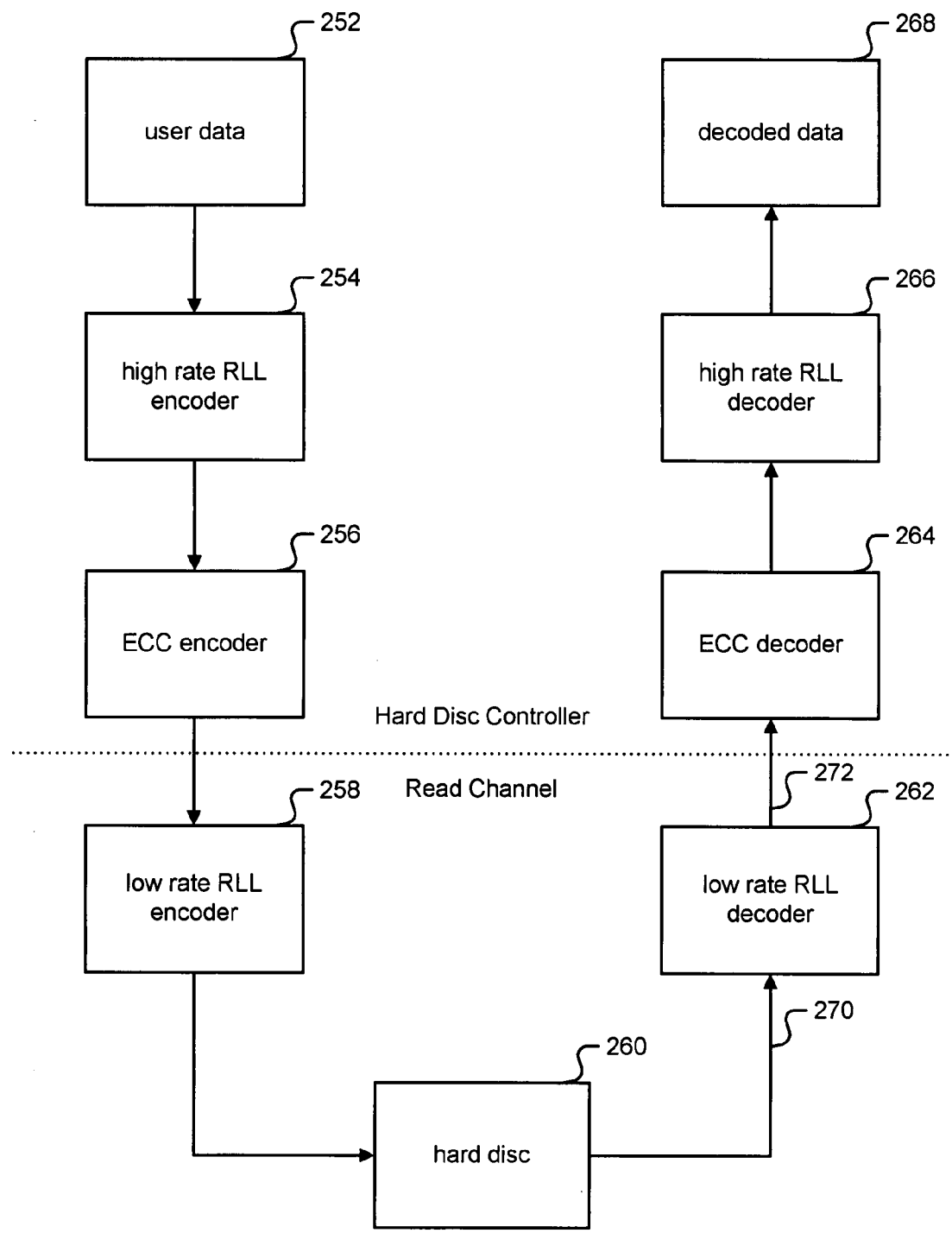
FIG. 2B is a block diagram illustrating an example of a reverse coding technique for error correction coding coupled with line coding in a hard disc drive system.

FIG. 2B is a block diagram illustrating an example of a reverse coding technique for error correction coding coupled with line coding in a hard disc drive system. In the example shown, user data 252, high rate RLL encoder 254, ECC encoder 256, ECC decoder 264, high rate RLL decoder 266, and decoded data 268 are part of the hard disc controller. In the example shown, low rate RLL encoder 258, low rate RLL decoder 262 and the hard disc 260 are part of the read channel.

In the example shown, user data 252 is first encoded using high rate RLL encoder 254. An example of a high rate RLL code used in the reverse coding technique for modern hard disc systems is a rate-200/201 (0, 20/20) RLL code. The output of the high rate RLL encoder 254 is the input of ECC encoder 256. The ECC code may be, for example, a Reed-Solomon code or an LDPC code. The encoded data is then passed to a low rate RLL decoder 258. An example of a low rate RLL code used in the reverse coding technique for modern hard disc systems is a rate-60/61 (0, 10/10) RLL code.

By first encoding using the high rate RLL encoder 254 before the ECC encoder 256, the high rate RLL code is protected by the parity of the ECC code. However, the resultant ECC encoded data at the output of ECC encoder 256 is not guaranteed to be run length constrained, and a low rate RLL code encoder 258 must be used.

One disadvantage of the reverse coding technique is the inefficiency of using two RLL coding schemes, since the overall RLL code rate is low due to the low rate RLL code in low rate RLL encoder 258. A second disadvantage of the reverse coding technique is that error propagation is still a vulnerability of the system. For example, for a rate-60/61 (0, 10/10) RLL code in the hard disc system shown in FIG. 2B, a single bit error at point 270 going to the input of the low rate RLL decoder 262 results in up to 60 bits in error at point 272 at the input to the low rate ECC decoder 264. For a hard disc system with 10 bits per symbol in the ECC code, this results in 6 symbol errors at ECC decoder 212.

What is disclosed is a technique for reducing all error propagation, while maintaining RLL code efficiencies. In some embodiments, this technique is a zero overhead interleaver solution. The following figure illustrates one embodiment.

Figure 3:
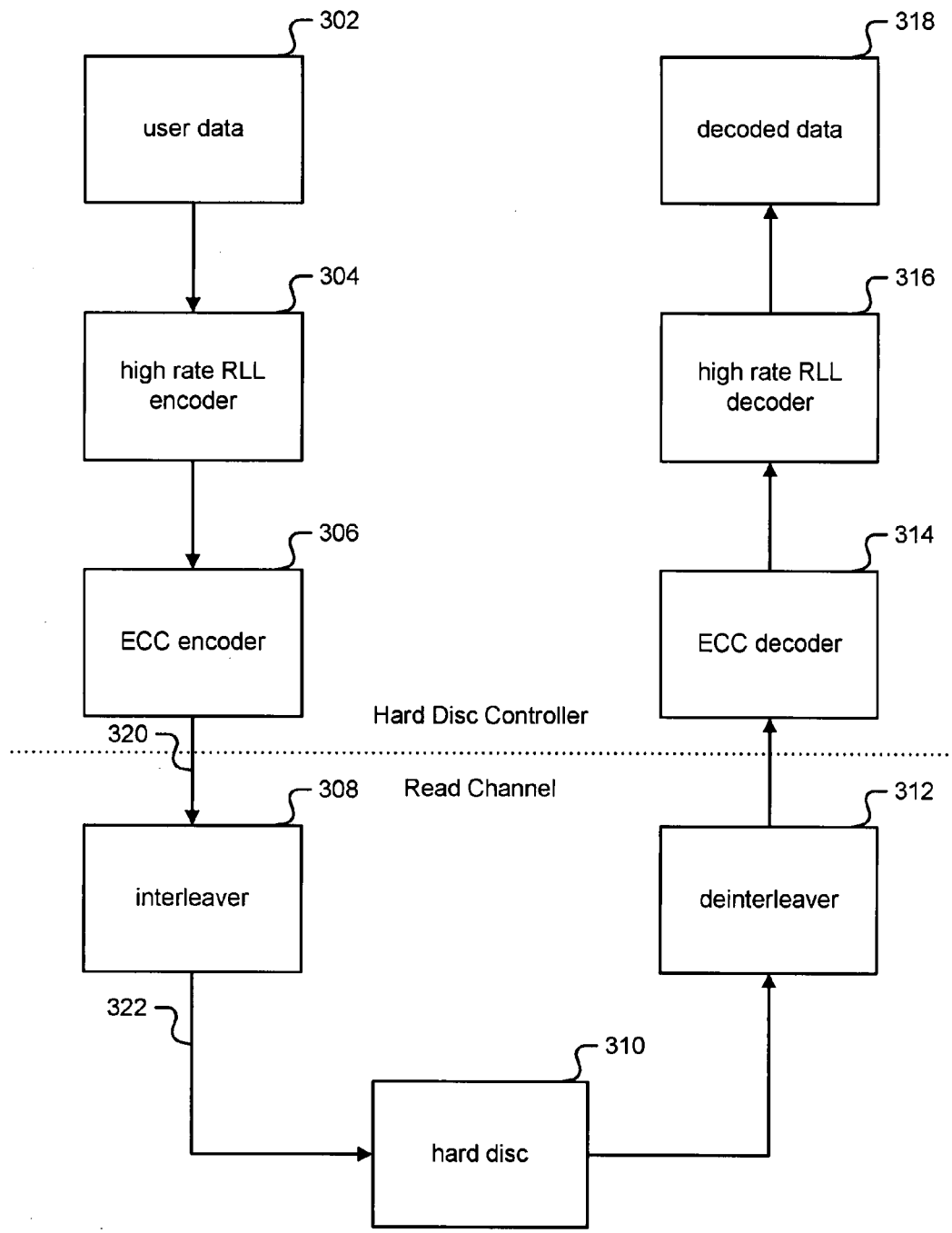
FIG. 3 is a block diagram illustrating an embodiment of a technique for error correction coding coupled with line coding in a hard disc drive system.

FIG. 3 is a block diagram illustrating an embodiment of a technique for error correction coding coupled with line coding in a hard disc drive system. In the example shown, user data 302, high rate RLL encoder 304, ECC encoder 306, ECC decoder 314, high rate RLL decoder 316, and decoded data 318 are part of the hard disc controller. In the example shown, interleaver 308, deinterleaver 312 and the hard disc 310 are part of the read channel.

In the example shown, user data 302 is first encoded using high rate RLL encoder 304. In various embodiments, various RLL codes may be used with an initial run length constraint of (0, G/I). An example of a high rate RLL code used in this technique for modern hard disc systems is a rate-200/201 (0, 20/20) RLL code. The output of the high rate RLL encoder 304 is the input of ECC encoder 306. In some embodiments, the ECC code must be a systematic code, such that parity symbol locations are fixed and known. In various embodiments, various ECC codes may be used. The ECC code may be, for example, a systematic Reed-Solomon code or a systematic LDPC code. The encoded data is then passed to a interleaver 308. In various embodiments, interleaver 308 is a deterministic and/or uniform interleaver.

The interleaver 308 interleaves parity symbols from the output of ECC encoder 306 uniformly with the data symbols from the output of ECC encoder 306. For example, the output of the ECC encoder 306 at point 320 is defined as a vector of symbols [R^{bar} P^{bar}], where:
   R^{bar}=[R_{0}, R_{1}, ..., R_{N}] are the data symbols; and
   P^{bar}=[P_{0}, P_{1}, ..., P_{M}] are the parity symbols;

The interleaver 308 would then output at point 322 a vector of symbols {RP}^{bar}, such that:
   {RP}^{bar}=[R_{0}, R_{1}, ..., R_{J-1}, P_{0}, R_{J}, R_{J+1}, ... R_{2J-1}, P_{1}, R_{2J}, R_{2J+1}, ... P_{M}]; and
   J is the quotient of N divided by M.

In some embodiments, with the parity symbols interleaved in the data symbols, the run-length constraints are relaxed slightly to reflect a worst-case scenario with the interleaved sequence. If the output of an ECC encoder is grouped into S bits per symbol, and the RLL code is used with an initial run length constraint of (0, G/I), it can be shown algebraically that the output of interleaver 308 at point 322, sequence {RP}^{bar}, satisfies a (0, (G+S)/(I+(S/2))) run-length constraint. In some embodiments, the constraint can be further improved by splitting the parity symbols into subsymbols and interleaving them. The interleaver is not limited to uniformly interleaving symbols. As long as the interleaving pattern is deterministic and the shortest distance between two parity symbols is no shorter than the smaller value of G and 2I, the property of run length constraint holds.

By using a systematic ECC code and interleaving the parity symbols with the data symbols evenly, techniques described herein maintain the efficiency of the high rate RLL code while removing or reducing error propagation. In some embodiments, the tradeoff of using this technique is an adjustment of the initial run-length constraint (0,G/I) to the new value (0, (G+S)/(I+(S/2))).

Figure 4:
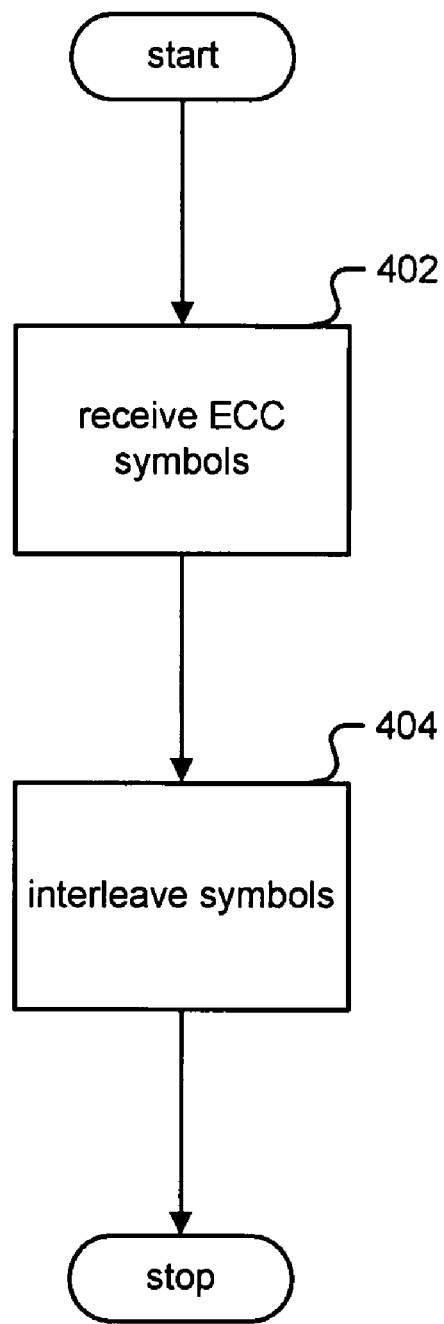
FIG. 4 is a flowchart illustrating an embodiment of a process to satisfy a specified run length constraint for a system.

FIG. 4 is a flowchart illustrating an embodiment of a process to satisfy a specified run length constraint for a system. The process may be implemented in interleaver 308.

In a step 402, the received symbols are received from high rate RLL encoder 304 and ECC encoder 306. The data symbols satisfy an initial run length constraint (0,G/I) as specified by the RLL code. The ECC code is a systematic code with S bits per symbol, such that data symbols are distinguishable from parity symbols.

In a step 404, the data symbols are interleaved uniformly with the parity symbols. For example, the received symbols are defined as a vector of symbols [R^{bar} P^{bar}], where:
   R^{bar}=[R_{0}, R_{1}, ..., R_{N}] are the data symbols; and
   P^{bar}=[P_{0}, P_{1}, ..., P_{M}] are the parity symbols;
The data and parity symbols are interleaved to produce a vector of symbols {RP}^{bar}, such that:
   {RP}^{bar}=[R_{0}, R_{1}, ..., R_{J-1}, P_{0}, R_{J}, R_{J+1}, ... R_{2J-1}, P_{1}, R_{2J}, R_{2J+1}, ... P_{M}]; and
   J is the quotient of N divided by M.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of satisfying a specified run length constraint, including:
   receiving a systematically error correction encoded sequence of received symbols, wherein the received symbols include data symbols and parity symbols; and
   using a processor interleave the parity symbols with the data symbols to produce interleaved symbols that satisfy the specified run length constraint, wherein:
      the interleaving does not uniformly interleave the symbols; and an interleaving pattern is deterministic and a shortest distance between two parity symbols is no shorter than a smaller value of G and 2I, wherein G is a maximum number of zeroes between two ones in the systematically error correction encoded sequence and when looking at two different subsequences, one composed of each odd bit in the systematically error correction encoded sequence and the other composed of each even bit in the systematically error correction encoded sequence, I is a maximum number of zeroes between two ones in either subsequence.

2. A method as recited in claim 1, wherein the data symbols satisfy an initial run length constraint.

3. A method as recited in claim 1, wherein the data symbols satisfy an initial run length constraint, and the specified run length constraint is based on the initial run length constraint.

4. A method as recited in claim 1, wherein the error correction encoded sequence is encoded with a line code and an error correction code.

5. A method as recited in claim 1, wherein the error correction encoded sequence is encoded with a line code and a Reed Solomon code.

6. A method as recited in claim 1, wherein the error correction encoded sequence is encoded with a line code and an LDPC code.

7. A method as recited in claim 1, wherein the interleaved symbols are used in a communications device.

8. A method as recited in claim 1, wherein the interleaved symbols are used in a storage device.

9. A method as recited in claim 1, wherein the interleaved symbols are used in a communications device, including a disc drive system.

10. A method as recited in claim 1, wherein the interleaving is performed at a bit level.

11. A system for satisfying a specified run length constraint, including:
    a receiver configured to:
        receive a systematically error correction encoded sequence of received symbols, wherein the received symbols include data symbols and parity symbols; and
        interleave the parity symbols with the data symbols to produce interleaved symbols that satisfy the specified run length constraint, wherein:
            the interleaving does not uniformly interleave the symbols; and
            an interleaving pattern is deterministic and a shortest distance between two parity symbols is no shorter than a smaller value of G and 2I, wherein G is a maximum number of zeroes between two ones in the systematically error correction encoded sequence and when looking at two different subsequences, one composed of each odd bit in the systematically error correction encoded sequence and the other composed of each even bit in the systematically error correction encoded sequence, I is a maximum number of zeroes between two ones in either subsequence; and
    an interface coupled with the receiver.

12. A system as recited in claim 11, wherein the data symbols satisfy an initial run length constraint.

13. A system as recited in claim 11, wherein the data symbols satisfy an initial run length constraint, and the specified run length constraint is based on the initial run length constraint.

14. A system as recited in claim 11, wherein the error correction encoded sequence is encoded with a line code and an error correction code.

15. A system as recited in claim 11, wherein the error correction encoded sequence is encoded with a line code and a Reed Solomon code.

16. A system as recited in claim 11, wherein the error correction encoded sequence is encoded with a line code and an LDPC code.

17. A system as recited in claim 11, wherein the interleaved symbols are used in a communications device.

18. A system as recited in claim 11, wherein the interleaved symbols are used in a storage device.

19. A system as recited in claim 11, wherein the interleaved symbols are used in a communications device, including a disc drive system.

20. A computer program product for satisfying a specified run length constraint, the computer program product being embodied in a tangible computer readable medium and comprising computer instructions for:
    receiving a systematically error correction encoded sequence of received symbols, wherein the received symbols include data symbols and parity symbols; and
    interleaving the parity symbols with the data symbols to produce interleaved symbols that satisfy the specified run length constraint, wherein:
        the interleaving does not uniformly interleave the symbols; and
        an interleaving pattern is deterministic and a shortest distance between two parity symbols is no shorter than a smaller value of G and 2I, wherein G is a maximum number of zeroes between two ones in the systematically error correction encoded sequence and when looking at two different subsequences, one composed of each odd bit in the systematically error correction encoded sequence and the other composed of each even bit in the systematically error correction encoded sequence, I is a maximum number of zeroes between two ones in either subsequence.

* * * * *